United States Patent [19]
Desai

[11] 3,944,940
[45] Mar. 16, 1976

[54] VERSATILE PHASE-LOCKED LOOP FOR READ DATA RECOVERY

[75] Inventor: Ashok K. Desai, Chatsworth, Calif.

[73] Assignee: Pertec Corporation, Chatsworth, Calif.

[22] Filed: Sept. 6, 1974

[21] Appl. No.: 503,864

[52] U.S. Cl. .............. 329/122; 325/346; 325/419; 329/50; 329/126; 331/11; 331/27; 360/51; 360/73
[51] Int. Cl.² ............................................ H03D 3/18
[58] Field of Search ........ 329/50, 122, 126; 331/18, 331/23, 25, 11, 27; 325/346, 419; 360/73, 51

[56] References Cited
UNITED STATES PATENTS

| | | | |
|---|---|---|---|
| 3,044,020 | 7/1962 | Russell | 329/50 X |
| 3,469,198 | 9/1969 | Madsen | 329/122 X |
| 3,657,661 | 4/1972 | Jarger | 331/23 |
| 3,813,604 | 5/1974 | Denoncourt | 329/122 |
| 3,825,844 | 7/1974 | Peterman et al. | 329/122 |
| 3,863,156 | 1/1975 | Bogert | 325/346 |

Primary Examiner—John Kominski
Attorney, Agent, or Firm—Lindenberg, Freilich, Wasserman, Rosen & Fernandez

[57] ABSTRACT

A clock pulse generating system is disclosed for recovery of read data from magnetic record media comprised of a phase-locked loop for tracking data pulses. The loop employs simple digital logic gates for phase error detection, third-order filtering for the transient phase and frequency error reduction and a voltage controlled oscillator (VCO) comprised of a capacitor charged by current from a voltage controlled current source, voltage threshold detection means, and means responsive to the threshold detection means to quickly discharge the capacitor. The VCO includes a flip-flop at its output to produce a square-wave feedback signal to the phase detection gates and to a data recovery circuit.

10 Claims, 3 Drawing Figures

VERSATILE PHASE-LOCKED LOOP FOR READ DATA RECOVERY

BACKGROUND OF THE INVENTION

This invention relates to the recovery of magnetic recorded binary data, and more particularly to a phase-locked loop for tracking recorded binary data as it is read to provide clock pulses for use in data recovery.

Phase-locked loops (PLL's) have been employed in the past to track and phase lock onto data from magnetically recorded medium. The output of the PLL is then used as a clock for data recovery. However, in each case the PLL has evidently been designed for the particular application, i.e., for the data rate of the magnetic recording system. For example, in a cassette magnetic tape system capable of recording with a bit density of 800 bits per inch, some systems will operate at 3 IPS while others will operate at 6 IPS. A PLL designed to operate optimally at 2400 bits per second will not track well at 4800 bits per second. What is required is a low cost PLL with versatility for adaptability to different uses over a wide range of operating frequencies, such as 1KHz to 10 or 20 MHz.

SUMMARY OF THE INVENTION

In accordance with the present invention, a versatile and inexpensive PLL is provided in which coincidence gating means are employed for phase error detection between a pulse train of the VCO feedback signal and a train of read pulses shaped to have a pulse width approximately one half of the data pulse period, as recorded pulses are read from a magnetic record medium. The phase error detected is filtered by second and third order filters to provide a corrective voltage (error) signal applied as a control to a voltage controlled oscillator comprised of: a capacitor charged by current from a voltage controlled current source, a threshold detection means, and means responsive to the threshold detection means to discharge the capacitor at a rate greater than the charge rate by a factor of at least ten. The cyclic output of the voltage controlled oscillator is divided by two in a flip-flop to produce a train of pulses in the VCO feedback signal at a frequency equal to the read pulse rate and with a pulse width approximately equal to the pulse width of shaped read pulses.

The novel features that are considered characteristic of this invention are set forth with particularity in the appended claims. The invention will best be understood from the following description when read in connection with the accompanying drawings.

DESCRIPTION OF THE PREFERRED EMBODIMENTS

Figure 1:
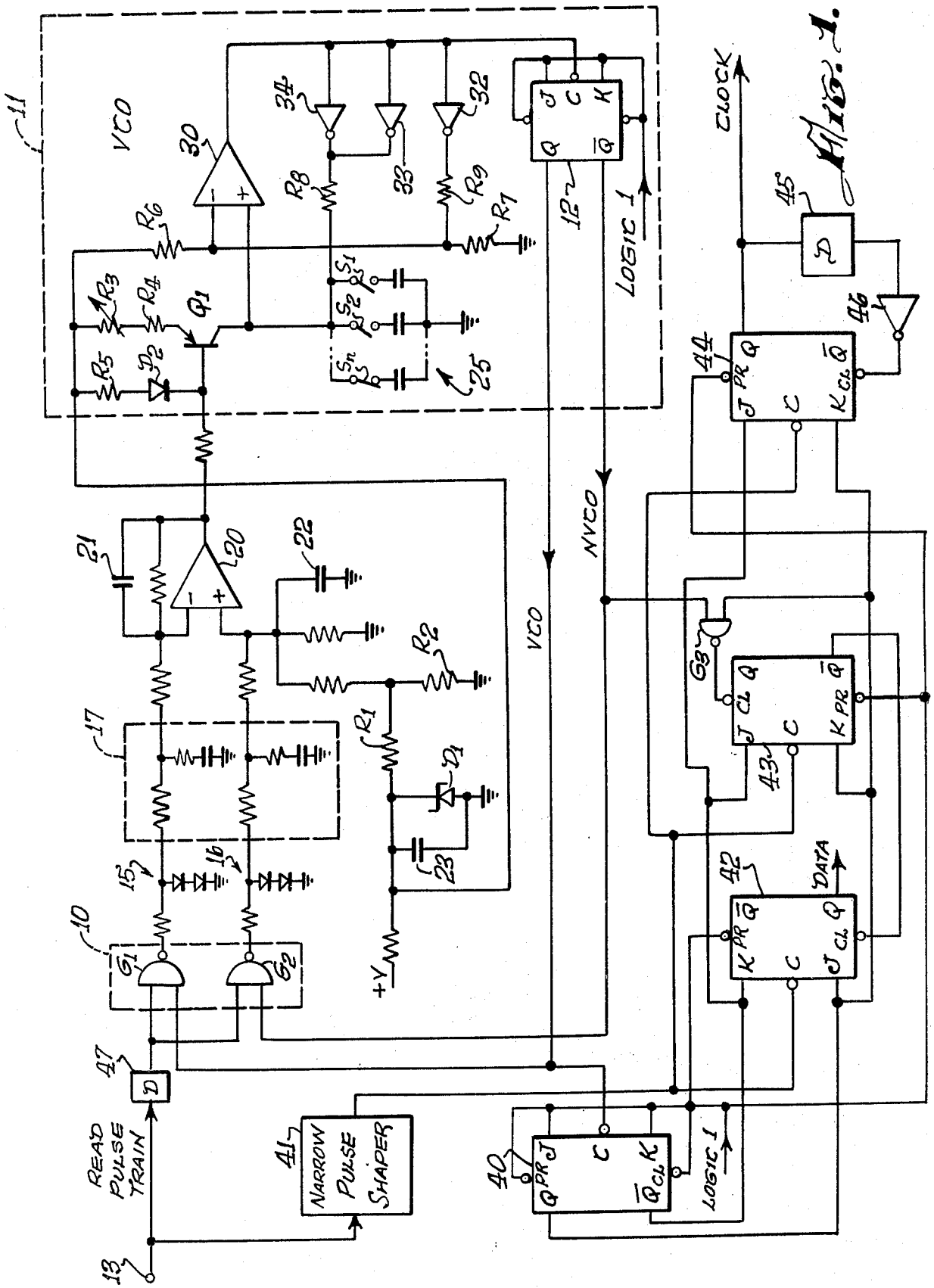
FIG. 1 is a schematic diagram of an exemplary data recovery system embodying the principles of the present invention.

A preferred embodiment of the present invention is shown in FIG. 1. The novel PLL is comprised of a simple and inexpensive phase error detector 10, a versatile VCO 11, and second and third order filtering of the phase error signal coupled from the phase detector to the VCO. The output of the VCO is taken from a flip-flop 12 which provides a square-wave output for phase comparison with a delayed read pulse train appearing at an input terminal 13. The reason for the delay purposely introduced by an element 47 will be explained hereinafter. It has no bearing on the operation of the PLL. Consequently, for the present it will be assumed the delay period is zero and that the read pulse train is being applied directly to the phase error detector 10.

Before proceeding with a more detailed description of novel features in the PLL, the recording method employed in a data storage system for which an exemplary data recovery system is provided with the present invention will first be described with reference to FIG. 2. The data storage system employs a single head for both read and write operations. The method of recording used is referred to as "double frequency" recording. In that recording method, data pulses are superimposed between clock pulses as shown in waveform A of FIG. 2. The clock pulses are indicated by the letter "C" and the data pulses by numerals "1" or "0". The numeral "0" indicates the position of a data pulse that is suppressed to designate a binary digit (bit) 0, while the numeral "1" indicates the position of a data pulse that represents a bit 1. The trailing edge of each clock pulse marks the beginning of a bit cell. Data pulses are spaced between the clock pulses so that the trailing edge of a bit 1 pulse marks one half of a bit cell. A flip-flop or its equivalence is triggered by the trailing edges of the clock and data pulses to produce a write driver control signal as shown in waveform B of FIG. 2. The resulting write current is as shown in the waveform C, and the flux pattern formed in the record medium is as shown in waveform D.

Figure 2:
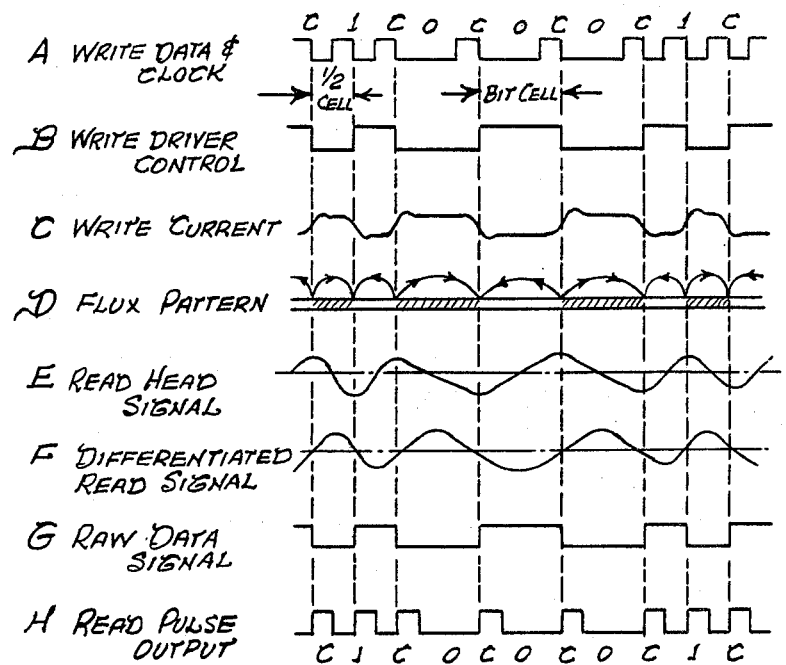
FIG. 2 is a timing diagram useful in understanding the double frequency recording method assumed for the exemplary embodiment of the present invention of the data recovery system.

During a read operation the signal induced across the read head is as shown in waveform E of FIG. 2. Upon amplifying and differentiating the read head signal, a signal is developed as shown in waveform F. The signal of waveform F is amplified in a high gain read amplifier which is driven between saturation and cut off to obtain a raw data signal of the form shown in waveform G. The raw data signal is further processed to form an output train of read pulses, one pulse for each transition in the signal level of the raw data signal. The width of each read pulse is approximately equal to one quarter of a bit cell, as shown in waveform H.

The read pulse train applied to terminal 13 necessarily consists of equally spaced clock pulses "interleaved" with data pulses. Consequently, the data pulses must ultimately be recovered from the read pulse train. The first step in the data recovery (decoding) process is to phase lock the VCO with the read pulse train. The center frequency of the VCO pulses at the output of the flip-flop 12 is selected to be the same as the nominal frequency of the read pulse train, i.e., at the same frequency of the read pulse train while reading a sequence of bit cells into each of which a bit one has been stored.

To enable the PLL to lock on the phase of the read pulse train, the beginning of each block of data written within a sector on the disc contains a preamble of a continuous sequence of bit cells into which a bit "zeroes" are written. The PLL will lock itself onto the read pulse train by comparing the phase of the VCO output pulses with that of the read pulses. That is done very simply in the phase detector 10 using two NAND gates $G_1$ and $G_2$.

Both the true (Q) and the false ($\bar{Q}$) outputs of the flip-flop 12 (referred to hereinafter as "VCO" and "NVCO" pulses, respectively) are compared in the respective gates $G_1$ and $G_2$ with the incoming read pulse train. While reading the preamble, every other pulse in the read pulse train is missing so the gates are effective only half the time. Nevertheless, the gates will produce phase error signals which are balanced (equal) if the VCO feedback pulses are 90° out of phase and lagging in phase with respect to the read pulses. If the lead should increase, less of the read pulses will overlap with the VCO feedback pulses to produce narrower pulses (i.e., narrower low true logic transition) out of the gate $G_1$, and at the same time wider pulses will be gated out of the gate $G_2$. That is according to the logical NAND function performed by the gates $G_1$ and $G_2$ between the feedback VCO and NVCO output pulses and the read pulses. It should be noted that simple AND or NOR gates could be used as well to perform the phase comparison.

If the lead of the read pulses should decrease, more of the read pulses will overlap with the VCO feedback pulses at the gate $G_1$ to produce wider pulses (i.e., wider low true logical transitions). At the same time, the output of the gate $G_2$ will become narrower. The outputs of the phase error detection gates are thus pulses whose widths are a function of the phase relationship between the read pulses and the VCO and NVCO feedback pulses.

It is evident that if the pulse-width modulated signals from the gates $G_1$ and $G_2$ are filtered, and that if the difference between the two signals is amplified, a null in the difference may occur when the phase difference is +90° or −90°, i.e., when the read pulses lead or lag by 90°. However, the condition of the read pulses lagging the VCO feedback pulses by 90° is unstable as it asserts positive feedback and as a result the VCO feedback pulses will never lock onto the read pulse train. This establishes that the VCO achieves the stable lock condition only if read pulses lead the VCO feedback pulses by 90°.

The pulses at the outputs of the gates $G_1$ and $G_2$ are standardized in amplitude by diode limiters 15 and 16, and fed to balanced low pass filters 17 which provide second order filtering. The outputs of the filters are fed to the inputs of a differential amplifier 20 connected to provide an output to the VCO that is proportional to the difference between the two input signals. A feedback capacitor 21 connected to the inverting (−) input terminal of the amplifier provides third order filtering in conjunction with a filter capacitor 22 connected to the noninverting (+) terminal. This second and third order filtering provides for proportional plus integral phase error correction. The transient response characteristics of the PLL has been designed such that its corrective (feedback) signal follows the low frequency variations with virtually no delay. Pulse to pulse (instantaneous) phase error variation caused by a phenomenon commonly termed "peak shift" is purposely ignored. The third order filter enhances the ability of the PLL to ignore peak-shift. This type of filtering will therefore improve the reliability of data recovery significantly.

An additional d-c signal is applied to the noninverting input of the amplifier 20 as a reference. That reference voltage is derived from a stable voltage source comprised of a Zener diode $D_1$, capacitor 23, and a voltage divider comprised of resistors $R_1$ and $R_2$. The reference voltage provides a d-c offset to set the nominal frequency of the VCO when no read pulses are present.

The VCO is comprised of a voltage controlled current source for an oscillator of the charging capacitor type. The voltage controlled current source includes transistor $Q_1$, resistors $R_3$ and $R_4$, diode $D_2$ and resistor $R_5$. The phase error signal is applied to the base of the transistor to control the current which charges a selected one or more of a bank of capacitors 25. The VCO also includes a comparator 30 and inverters 32, 33 and 34. The capacitor selection is shown to be made by closing switches $S_1$-$S_n$, but in practice the selection is made by soldering one or more capacitors of the proper size in the circuit once the application of the data recovery system is known. If the application is expected to vary from time to time at frequent intervals, the switches shown may well be provided to easily change the selection of capacitors for the different applications.

When the voltage on the selected capacitor exceeds a threshold voltage level set by resistors $R_6$ and $R_7$, the output of the comparator 30 is set to a high logic level. Inverters 32, 33 and 34 in turn set their outputs to a low logic level. This causes the capacitor to discharge quickly through a resistor $R_8$. The discharge rate is greater than the charge rate by a factor of 10 or more.

The capacitor discharges to a voltage level set by resistor $R_9$ in cooperation with resistors $R_6$ and $R_7$. When the voltage across the capacitor falls below this voltage level, the output of the comparator 30 goes to a low logic level. That then drives the outputs of the inverters 32, 33 and 34 to a high logic level to permit the capacitor to again charge up. A pulse train is thus produced at the output of the comparator 30 whose frequency is a function of the voltage signal applied to the voltage controlled current source. As that signal increases, current decreases and the frequency at the output of the comparator 30 decreases.

Resistor $R_3$ provides for the fine adjustment of center (nominal) frequency of the VCO when the read pulse line is grounded. The center frequency of the VCO is the measured frequency of the output of the flip-flop 12 and is equal to the frequency of the input read pulses while reading a sequence of bit cells into which there has been recorded all ones.

The manner in which the square-wave output of the VCO is employed to decode the data contained in the pulse train of waveform H in FIG. 2 will now be described with reference to FIGS. 1 and 3. Also involved in the data decoding is the separation of clock pulses from the read pulse train.

The data decoding process to be described is included for reference and understanding only. It involves generating from the VCO output both a data "window" and a clock "window" shown in waveforms B and C of FIG. 3 using a J-K flip-flop 40 connected as shown in FIG. 1 to reverse state at each cycle of the output VCO. The true (Q) output of the flip-flop 40 is used as the data "window" shown in waveform B of FIG. 3. The false ($\bar{Q}$) output of the flip-flop 40 is used as the clock "window." The latter is properly the compliment of the data "window."

Figure 3:
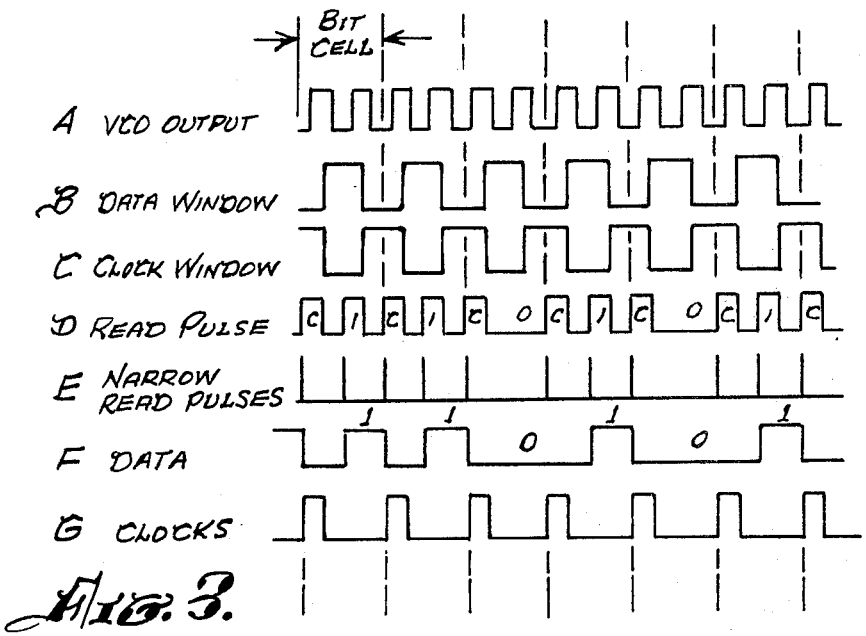
FIG. 3 is a timing diagram useful in understanding the manner in which data is decoded from the read pulse train shown in FIG. 2.

The leading edges of the pulses in the read pulse train at the input terminal 13 are detected by a pulse shaper 41 to form narrow read pulses shown in waveform E of FIG. 3. Assuming the flip-flop 40 is correctly initialized, its true output waveform provides a window for the actual data pulses to be strobed into a J-K flip-flop 42 by the narrow read pulses from the pulse shaper 41. Both the true and false outputs of the flip-flop 40 are connected to the respective J and K terminals of the flip-flop 42 so that the true (Q) output of flip-flop 42 will be set to Logic "1" State (One-Set) at the trailing edge of the narrow read pulse when the Q output of flip-flop 40 is in the High (Logic "1") State.

A flip-flop 43 having its J and K input terminals connected oppositely (i.e., having its K and J input terminals connected to the true and false output terminals of the flip-flop 40) such that when the true (Q) output of flip-flop 40 is LOW (Logic "0" State), the true (Q) output of flip-flop 43 will be one-set (i.e., to Logic "1" State) by the trailing edge of narrow read pulse. The false ($\bar{Q}$) output of the flip-flop 43 clears the flip-flop 42 to the Logic Low (bit 0) level. The result is a data waveform F shown in FIG. 3 at the true (Q) output of flip-flop 42. The flip-flop 43 is cleared (i.e., the Q output of flip-flop is set to Logical "0"), in turn, by the output of NAND gate $G_3$.

The clock (c) pulses in the read pulse train (waveform D of FIG. 3) are decoded by a flip-flop 44 having its J input connected to the clock "window" ($\bar{Q}$ output of flip-flop 40) and its K input connected to the data "window" (Q output of flip-flop 40). The true (Q) output of flip-flop 44 will be ONE-set (i.e., to a Logical "1") at the trailing edge of the narrow read pulse, when the $\bar{Q}$ output of flip-flop 40 (the clock window) is in the HIGH (logical "1") state. Also, a delay network 45 delays in time the Q output of flip-flop 44. The output of the delay network 45 is logically inverted by inverter 46 and applied to the "clear" input of flip-flop 44 so that when the true (Q) output of flip-flop 44 is ONE-set, after a pre-determined (fixed) time delay, the flip-flop 44 gets cleared and the true (Q) output of flip-flop 44 is again Zero-set (i.e., to a Logical "0" state). The result is a clock waveform G, shown in FIG. 3, at the true (Q) output of flip-flop 44.

The pulse shaper 41 introduces some delay in the generation of the narrow read pulses of waveform E. To maintain proper phase relationship with the train of narrow read pulses and the VCO output, a delay means 47 is introduced between the input terminal 13 and the PLL.

The condition assumed, namely that the flip-flop 40 is correctly initialized to produce a data window during the presence of a data pulse and not during the presence of a clock pulse, is checked while reading the preamble of a block of data. That may be done by detecting the presence of "clock" pulses at the output of flip-flop 44. If none occur during a set period of the preamble, notwithstanding the presence of pulses at the output of the narrow pulse shaper 41, the phase of the flip-flop 40 is then reversed. Clock pulses will then appear at the output of the flip-flop 44. That assures the data "window" is in phase with data pulses and the clock "window" is in phase with clock pulses.

Although particular embodiments of the invention have been described and illustrated herein, it is recognized that modifications and variations may readily occur to those skilled in the art and consequently it is intended that the claims be interpreted to cover such modifications and equivalents.

The embodiments of the invention in which an exclusive property or privilege is claimed are defined as follows:

1. In a binary magnetic record recovery system, a phase-locked loop responsive to a train of read pulses for generating reference pulses for use in data recovery comprising:
  voltage controlled means responsive to a corrective phase error signal for producing two square wave feedback signals at the frequency of said train of read pulses when a known cyclic pattern of recorded pulses are being read back, one feedback signal being 180° out of phase with the other,
  first coincidence gating means for comparing said train of read pulses with the phase of said one feedback signal by transmitting an output signal of a predetermined binary level only during the period of each feedback signal cycle that both are at a selected binary signal level,
  second coincidence gating means for comparing said train of data pulses with the phase of said other feedback signal by transmitting an output signal of said predetermined binary level only during the period of each feedback signal cycle that both are at said selected binary signal level,
  first and second low pass filter means for separately filtering said output signals of said first and second coincidence gating means, and
  differential amplifying means for producing said corrective phase error signal proportional to the difference between output signals of said first and second low pass filtering means connected to a pair of differential input terminals of said amplifier.

2. The combination of claim 1 including third-order filtering means for filtering signals at said differential input terminals of said amplifying means, thereby making said phase-locked loop non-responsive to pulse-to-pulse phase shift variations of said input data pulse train.

3. The combination of claim 1 wherein pulses of said input read pulse train are shaped to have a pulse width approximately one half of the read pulse period, and including means for limiting the signal outputs of said first and second coincidence gating means, whereby output signals from said first and second low-pass filtering means are strictly proportional to phase differences between input read pulses and feedback signal pulses with a null in said corrective phase error signal when said phase differences are 90° with a predetermined one of the pulse trains compared leading the other.

4. The combination of claim 3 including third-order filtering means for filtering signals at said differential input terminals of said amplifying means, thereby making said phase-locked loop non-responsive to pulse-to-pulse phase shift variations of said input data pulse train.

5. The combination of claim 1 wherein said voltage controlled means for producing said two feedback signals 180° out of phase with each other is comprised of:
  an integrating capacitor and a voltage controlled current source for charging said capacitor, said current source being connected to receive said corrective phase error signal as its control signal,
  means for detecting when said capacitor has been charged to a predetermined threshold voltage, and for producing an output transient signal each time, means responsive to said output transient signal for quickly discharging said capacitor when said threshold voltage is detected, and means responsive to said output transient signal for producing said feedback signal pulses with a period for each cycle equal to twice the period between transients of said output transient signal.

6. The combination of claim 1 wherein said read pulses consist of interlaced clock pulses recorded between binary data pulses such that each clock pulse read has a pulse width equal approximately one quarter a data pulse period, and each data pulse read has a pulse width equal to approximately one quarter a data pulse period, and said data pulses are equally spaced between read clock pulses, with the presence of a read data pulse representing one binary value and the absence of a read data pulse representing another binary value.

7. In a system for reading magnetically recorded binary data, a phase-locked loop for generating local reference pulses for use in data recovery comprising:

a voltage controlled means responsive to a corrective voltage signal for producing two square wave feedback signals 180° out of phase, first gating means having two input terminals and one output terminal for translating pulses from one input terminal thereof to said output terminal while one of said two feedback signals present at the other input terminal is of the same predetermined binary voltage level as pulses at said one input terminal, whereby pulse-width modulation of pulses translated is achieved as a function of phase difference between pulses at said two input terminals, second gating means having two input terminals and one output terminal for translating from one input terminal thereof to said output terminal while the other one of said two feedback signals present at the other input terminal is of the same predetermined binary voltage level as pulses at said one input terminal, whereby pulse-width modulation of pulses translated is achieved as a function of phase difference between pulses at said two input terminals, means for coupling read pulses to said one input terminal of each of said first and second gating means, first means for second order low-pass filtering pulses at said output terminal of said first gating means, second means for second order low-pass filtering pulses at said output terminal of said first gating means, differential means for forming a difference signal between the outputs of said first and second filtering means, and means for coupling said difference signal as said corrective voltage signal to said voltage control means.

8. The combination as defined in claim 7 including means for third-order low-pass filtering of said difference signal as it is formed to eliminate from said corrective voltage signal pulse-to-pulse phase shift variations between said read pulses and said feedback signals.

9. The combination as defined in claim 8 wherein said voltage controlled means is comprised of:

an integrating capacitor and a voltage controlled current source for charging said capacitor, said current source being connected to receive said corrective voltage signal as its control signal, means for detecting when said capacitor has been charged to a predetermined threshold voltage, and for producing an output transient signal each time, means responsive to said output transient signal for quickly discharging said capacitor when said threshold voltage is detected, and means responsive to said output transient signal for producing said feedback signal pulses with a period for each cycle equal to half the period between transients of said output transient signal.

10. The combination as defined in claim 9 wherein said read pulses consist of interlaced clock pulses recorded between binary data pulses such that each clock pulse read has a pulse width equal approximately one quarter a data pulse period, and each data pulse read has a pulse width equal to approximately one quarter a data pulse period, and said data pulses are equally spaced between read clock pulses, with the presence of a read data pulse representing one binary value and the absence of a read data pulse representing another binary value.

* * * * *